United States Patent [19]

Takeshita et al.

[11] Patent Number: 4,920,513
[45] Date of Patent: Apr. 24, 1990

[54] SEMICONDUCTOR MEMORY DEVICE USING DIODE-CAPACITOR COMBINATION

[75] Inventors: Kaneyoshi Takeshita, Tokyo; Takeshi Matsushita, Kanagawa, both of Japan

[73] Assignee: Sony Corporation, Tokyo, Japan

[21] Appl. No.: 171,486

[22] Filed: Mar. 21, 1988

[30] Foreign Application Priority Data

Mar. 24, 1987 [JP] Japan .................. 62-070950

[51] Int. Cl.5 .................. G11C 7/00; G11C 11/36
[52] U.S. Cl. .................... 365/175; 365/149
[58] Field of Search ............. 365/174, 175, 105, 149, 365/218; 357/23.6, 45, 14

[56] References Cited

U.S. PATENT DOCUMENTS 3,161,858 12/1964 Sanders et al. ............ 365/149
3,196,405 7/1965 Gunn ...................... 365/149
3,248,711 4/1966 Lewin ................... 365/149 X
3,540,011 11/1970 Stupp et al. ........... 365/149 X
3,916,392 10/1975 Richardson .............. 365/175
4,110,839 8/1978 Bert et al. ............ 365/174 X
4,569,121 2/1986 Lim et al. ............ 365/105 X Primary Examiner—Stuart N. Hecker
Assistant Examiner—Alyssa H. Bowler
Attorney, Agent, or Firm—Hill, Van Santen, Steadman & Simpson

[57] ABSTRACT

A semiconductor memory device having a number of memory cells. Each of the memory cells comprises a diode having a first electrode connected to a bit line. The diode has a second electrode connected at a point to one terminal of a storage capacitor, the other terminal of which is connected to a word line. A reset circuit is provided for resetting the point to a predetermined potential.

9 Claims, 4 Drawing Sheets

SEMICONDUCTOR MEMORY DEVICE USING DIODE-CAPACITOR COMBINATION

BACKGROUND OF THE INVENTION

This invention relates to a semiconductor memory device and, more particularly, to a dynamic random access memory device having a number of memory cells.

Conventional dynamic random access memory devices employ one-transistor type memory cells each including a MOS transistor and capacitor. However, there are certain undesirable characteristics of MOS transistors, primary in regard to their size limitation. A cell area is occupied by one MOS transistor including at least three regions; e.g., source, channel and drain regions. Accordingly, it is difficult to increase the memory cell density of the one-transistor type D-ROM without a great reduction of its permissible voltage. With a reduced power source voltage, however, the sub-threshold characteristic curve has a gentle slope, resulting in a dynamic random access memory device which is subjective to leak and exhibits low reliability.

SUMMARY OF THE INVENTION

Therefore, it is a main object of the invention to provide a semiconductor memory device having a number of memory cells each consuming far less space in the memory device.

There is provided, in accordance with the invention, a semiconductor memory device having a number of memory cells. Each of the memory cells comprises a diode having first and second electrodes. The first electrode is connected to a bit line. The memory cell also comprises a storage capacitor having first and second terminals. The first terminal is connected at a junction to the second electrode of the diode. The second terminal is connected to a word line. Means is provided for resetting the junction to a predetermined potential.

BRIEF DESCRIPTION OF THE DRAWINGS

This invention will be described in greater detail by reference to the following description taken in connection with the accompanying drawings, in which.

DETAILED DESCRIPTION OF THE INVENTION

Figure 1:
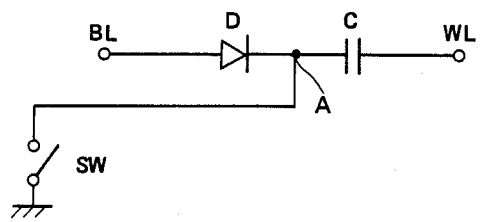
FIG. 1 is a schematic diagram showing one of memory cells which constitute a semiconductor memory device embodying the invention.

With reference to the drawings, where like numerals refer to like parts in the several views, and in particular to FIG. 1, there is a circuit diagram of one of memory cells which constitute a semiconductor memory device embodying the invention. The memory cell includes a diode D having an anode electrode connected to a bit line BL. The diode D also includes a cathode electrode connected to a word line through a storage capacitor C. The junction A of the diode D and the storage capacitor C is connected to ground through a reset switch circuit SW. The reset switch circuit SW is turned on, the junction A is reset to a ground potential. It is not necessary to provide the reset switch circuit SW for each of the memory cells. For example, only one reset switch circuit SW may be provided for a number of memory cells forming one memory-cell line segment, as described later.

As shown in FIG. 2A, the memory cell comprises a P-type substrate 1. A selected N-type well is formed at the surface of the P-type substrate 1. A selected P+ diffusion 3 is formed in the N-type well 2. Thus, the diode D has an N-P junction between the N-type well 2 and the P+ diffusion 3. The P+ diffusion 3 is connected to an electrode layer 4 which occupies a contact hole. The electrode layer 4 constitutes the bit line BL. An N+ diffusion 5 is formed at the surface of the P-type substrate 5. The N+ diffusion 5 is connected at a junction A to the N-type well 2. An electrode layer 7, which constitutes the word line WL, is formed above the N+ diffusion 5. A very thin isolation layer 6 retains the electrode layer 7 in spaced relationship to the N+ diffusion 5. The N+ diffusion 5, the isolation layer 6 and the electrode layer 7 constitute a MOS storage capacitor C.

Figure 2:
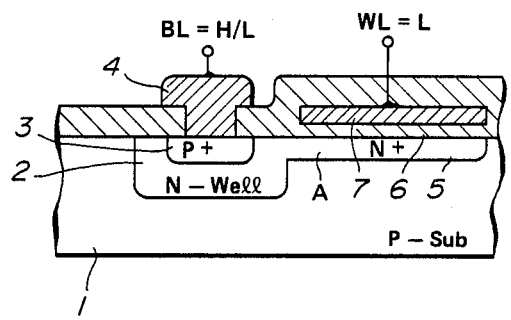
FIG. 2A is a fragmentary sectional view used in explaining the writing mode of operation of the memory cell.
FIG. 2B is a diagram showing the potential distribution of the storage capacitor during the writing mode of operation of the memory cell.
Figure 2:
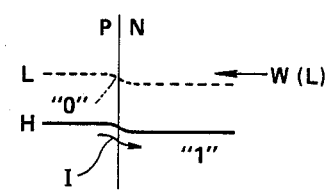
Figure 3:
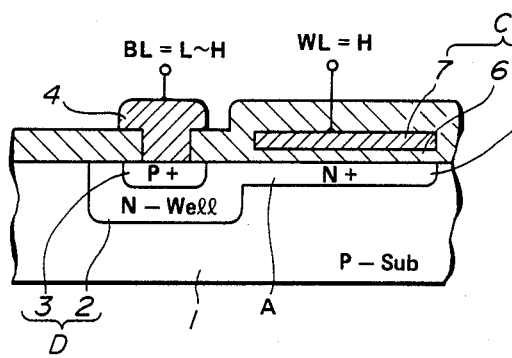
FIG. 3A is a fragmentary sectional view used in explaining the retaining mode of operation of the memory cell.
FIG. 3B is a diagram showing the potential distribution of the storage capacitor during the retaining mode of operation of the memory cell.
Figure 3:
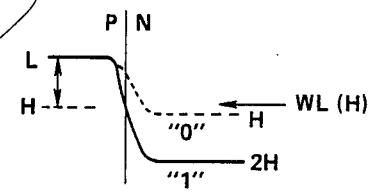

The operation of the memory cell will be described in connection with FIGS. 2, 3 and 4. When the memory cell is required to operate in a writing mode, the reset switch circuit SW is turned on to reset the junction A to a ground of low (L) level with the word line WL being held at a high (H) level of, for example, 5 volts. The reset operation is performed for one memory-cell line segment for which only one reset switch circuit SW is provided. Subsequent to the reset operation, the reset switch circuit SW is turned off and the word line WL is changed to the low (L) level. Under this condition, a binary value "1" can be written into the memory cell by changing the bit line BL to the high (H) level while retaining the word line at the low (L) level, as shown in FIG. 2A. As a result, the diode D is forward biased to charge the storage capacitor C. Under this condition, the junction A is changed to the high (H) level. Alternatively, a binary value "0" can be written into the memory cell by changing the bit line BL to the low (L) level while retaining the word line WL at the low (L) level, as shown in FIG. 2A. Consequently, the diode D is reverse biased. Under this condition, the junction A is held at the low (L) level. FIG. 2B shows the potential distribution of the storge capacitor C during the writing mode of operation of the memory cell.

As soon as the writing operation is terminated, the memory cell is shifted into a retaining mode by changing the word line WL from the low (L) level to the high (H) level, as shown in FIG. 3A. As a result, the junction A is changed from the high (H) level (5 volts) to a high (2H) level (10 volts) when the stored binary value is "1" or the junction A is changed from the low (L) level to the high (H) level when the stored binary value is "0". Consequently, the diode D is held reverse biased to make no change of the level of the junction A although the level of the bit line BL is changed between the high (H) and low (L) levels due to the writing or reading operation of another memory cell included in the same memory-cell row segment which employs a common bit line BL. FIG. 3B shows the potential distribution of the storage capacitor C during the retaining mode of operation of the memory cell.

Figure 4A:
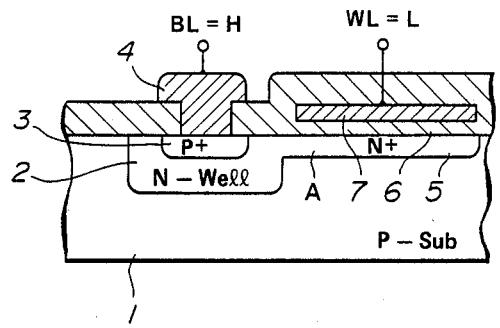
FIG. 4A is a fragmentary sectional view used in explaining the reading mode of operation of the memory cell.
Figure 4B:
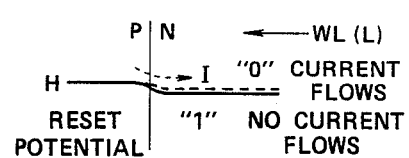
FIG. 4B is a diagram showing the potential distribution of the storage capacitor during the reading mode of operation of the memory cell.

When the memory cell is required to operate in a reading mode, the word line WL is changed to the low (L) level and the bit line BL is changed to the high (H) level, as shown in FIG. 4A. If the information stored in the storage capacitor C is "0", then the junction A is at the low (L) level and the diode D is forward biased to permit current flow through the diode D to the storage capacitor C. As a result, the level of the bit line BL is reduced from its high (H) level. If the information stored in the storage capacitor C is "1", then the junction A is at the high (H) level so that there is no potential difference across the diode D. As a result, the level of the bit line BL is held at its high (H) level. Thus, the information stored in the storage capacitor C is determined by comparing the level of the bit line BL with the level of a dummy data line. FIG. 4B shows the potential distribution of the storage capacitor C during the reading mode of operation of the memory cell.

Figure 5A:
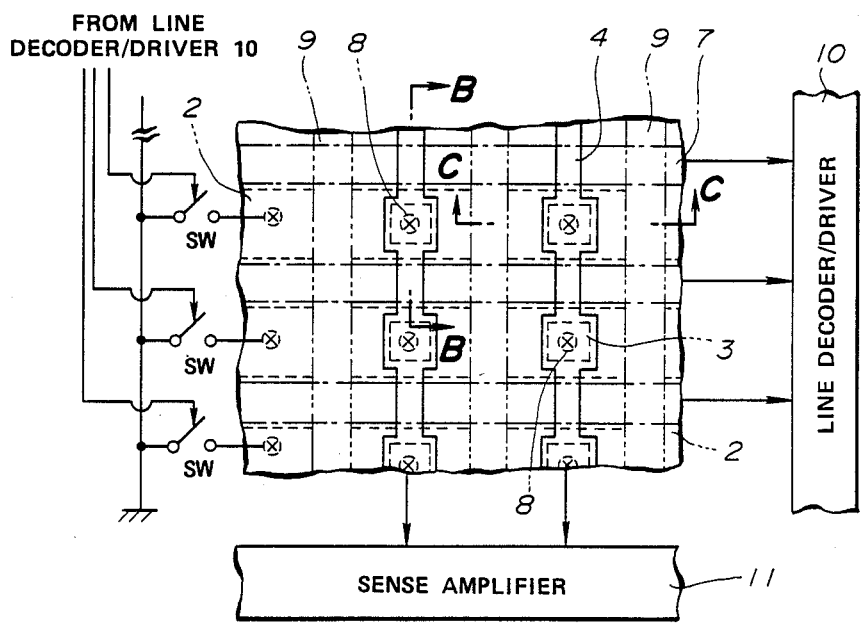
FIG. 5A is a plan view showing one embodiment of the semiconductor memory device of the invention.
Figure 5B:
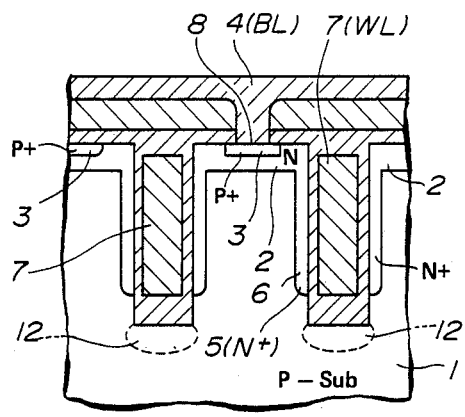
FIG. 5B is a fragmentary sectional view taken along the line B—B of FIG. 5A.
Figure 5C:
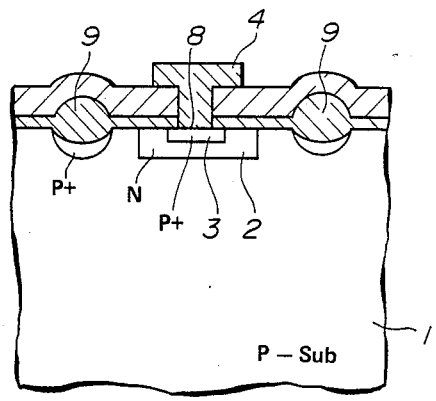
FIG. 5C is a fragmentary sectional view taken along the line C—C of FIG. 5A.

Referring to FIGS. 5A, 5B and 5C, there is illustrated one embodiment of the semiconductor memory device of the invention. In this embodiment, the invention is applied to an open data-line type memory device. An N-type thin layer 2 is formed at the surface of a P-type substrate 1. A selected P+ diffusion 3 is formed at the surface of the N-type thin layer 2. Thus, the diode D has an N-P junction present between the N-type thin layer 2 and the P+ diffusion 3. The P+ diffusion 3 is connected to an electrode layer 4 which occupies a contact hole 8. The electrode layer 4 constitutes the bit line BL. An N+ diffusion 5, which surrounds a poly-silicon layer 7 through an isolation layer 6, is connected as a unit to the N-type thin layer 2. The N+ diffusion 5 and the poly-silicon layer 7 constitute a trench storage capacitor C having a dielectric formed by the isolation layer 6. The poly-silicon layer 7 constitutes the word line WL.

As best shown in FIG. 5A, the memory cells are divided into a plurality of memory-cell line segments each including a plurality of memory cells connected by a common word line. The memory cells are also divided into a plurality of memory-cell row segments each including a plurality of memory cells connected by a common bit line. The numeral 9 designates oxide layers each isolating adjacent two memory-cell row segments from each other. A memory cell is formed in an area surrounded by two adjacent oxide layers 9 and two adjacent word lines WL extending in a direction perpendicular to the isolation layers 9.

The reset switch circuits SW, which are provided for the respective memory-cell row segments, are controlled by a line decoder/driver 10. The line decoder/driver 10 responds to a demand for resetting a selected memory cell by turning on the corresponding one of the reset switch circuits SW to connect the N-type thin layer 2 to ground. During the reset operation, the poly-silicon layer 7, which constitutes the word line WL, changes to its high (H) level. Under this condition, an N-channel MOS is temporarily established, the N-channel MOS having a gate formed by the poly-silicon layer 7. Consequently, the N-type semiconductor regions 2 and 5 included in the same memory-cell line segment are electrically connected through the N-channel MOS. It is, therefore, apparent that all of the storage capacitors C included in the memory-cell line segment are discharged through the respective junctions A when the corresponding reset switch circuit SW is turned on for effecting the reset operation. The numeral 11 designates a sense amplifier 11 for use in determining the information stored in each of the memory cells and the numeral 12 designates isolation layers which may be provided to isolate adjacent memory cells.

Since the open data-line type memory device includes adjacent two memory cells located on the opposite sides of one trench storage capacitor C, the level of the selected word lines WL located on the opposite sides of the selected memory cell is changed from the high (H) level to the low (L) level for writing information into the selected memory cell or reading the information from the selected memory cell. During this operation, it is required to change the word lines adjacent outward to the respective selected word lines to the high (2H) level to keep the non-selected memory cells free from the influence of the writing or reading operation.

Figure 6A:
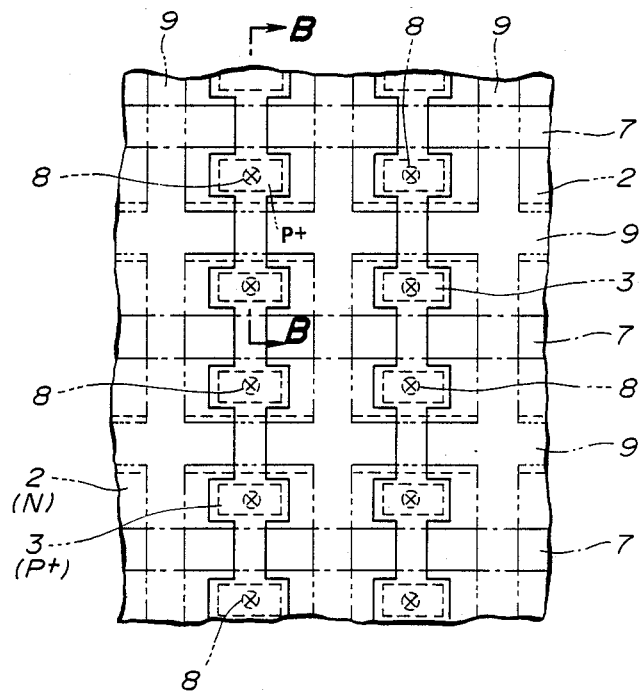
FIG. 6A is a plan view showing a modified form of the semiconductor memory device of FIG. 5A.
Figure 6B:
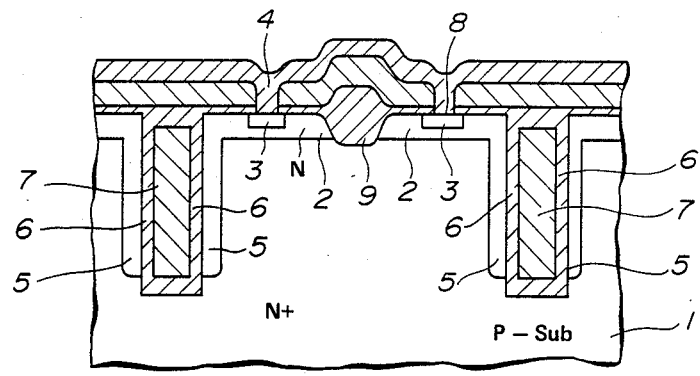
FIG. 6B is a fragmentary sectional view taken along the line B—B of FIG. 6A.

Referring to FIGS. 6A and 6B, there is illustrated a modified form of the semiconductor memory device of the first embodiment. The memory device includes a number of memory cells each having an N-type thin layer 2 formed at the surface of a P-type substrate 1. A selected P+ diffusion 3 is formed at the surface of the N-type thin layer 2. Thus, the diode D has an N-P junction present between the N-type thin layer 2 and the P+ diffusion 3. The P+ diffusion 3 is connected to an electrode layer 4 which occupies a contact hole 8. The electrode layer 4 constitutes the bit line BL. An N+ diffusion 5, which surrounds a poly-silicon layer 7 through an isolation layer 6, is connected as a unit to the N-type thin layer 2. The N+ diffusion 5 and the poly-silicon layer 7 constitute a trench storage capacitor C having a dielectric formed by the isolation layer 6. The poly-silicon layer 7 constitutes the word line WL. The numeral 9 designates oxide layers each isolating adjacent two memory-cell row segments from each other. A memory cell is formed in an area surrounded by two adjacent oxide layers 9 and two adjacent word lines WL extending in a direction perpendicular to the isolation layers 9.

In this modification, adjacent two memory cells, which are isolated by an isolation layer 9, are located between adjacent two word lines WL. Since one memory-cell line segment can be selected by only one word line WL, the memory device can operate under simpler control than required in the memory device of the first embodiment. Although the memory device of the first embodiment may be arranged to operate under simpler control by forming each capacitor on only one side of the corresponding trench, its memory capacity is reduced to one-half of the memory capacity of the memory device of the first embodiment.

Figure 7:
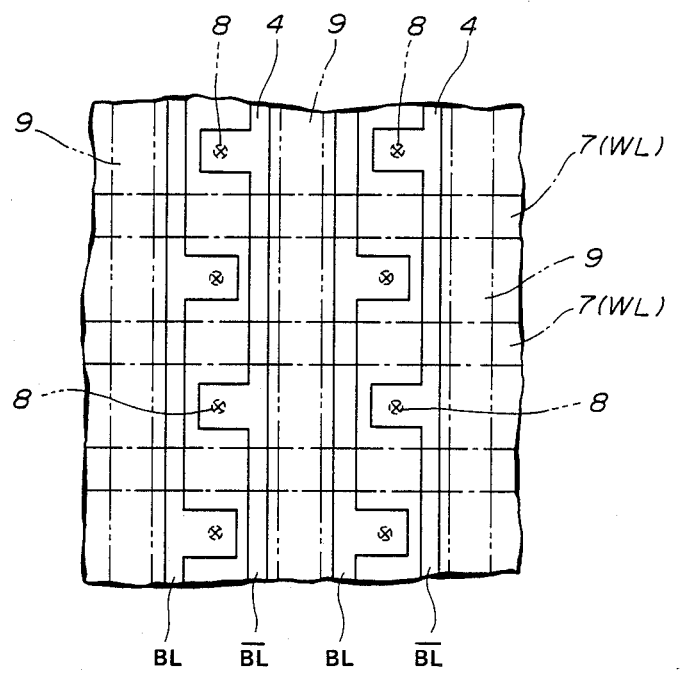
FIG. 7 is a plan view showing a second embodiment of the semiconductor memory device of the invention.

Referring to FIG. 7, there is illustrated a second embodiment of the semiconductor memory device of the invention. In this embodiment, the invention is applied to a turned bit line type memory device which includes a number of memory cells. The memory cells are divided into a plurality of memory-cell line segments each including a plurality of memory cells connected by a common word line WL. The memory cells are also divided into a plurality of memory-cell row segments each including a plurality of memory cells. The memory cells alternatively arranged in one of the memory-cell row segments are connected by a common bit line BL, the other memory cells in the one memory-cell row segment being connected by another common bit line BL. In this embodiment, it is required to change the work lines adjacent outward to the respective selected word lines to the high (2H) level to keep the non-selected memory cells free from the influence of the writing or reading operation like the first embodiment.

When it is required to read a binary value of "0" from the storage capacitor C, the diode D is forward biased so that the storage capacitor C is electrically connected to the bit line BL. If the memory cell is at a negative potential under this condition, carriers wil be impegnated into the semiconductor substrate 1, causing leakage to the other memory cells. In order to prevent such leakage, it is preferable to set the low (L) level of the bit lines B at a potential a voltage $V_F$ (for example, 0.6 volts) higher than the level of the semiconductor substrate 1. The voltage $V_F$ is the diode forward voltage.

In the arrangements where one reset switch circuit SW is provided for resetting all of the memory cells included in one memory cell line segment, the time required to reset the memory-cell line segment is long when the MOS FET established during the reset operation has a great channel resistance. It is, therefore, preferable to complete the reset operation in a time as short as 10 nanoseconds or less by providing a grounding source for every 20 or 30 memory cells.

It is apparent from the foregoing that there has been provided, in accordance with the invention, a semiconductor memory device having a number of memory cells each consuming far less space in the memory device.

Although the diode D is shown as connected in a polarity to permit current flow in a direction which charges the storage capacitor C, it is to be noted that the polarity of the diode D is not limited to the illustrated one. In addition, the memory-cell line segments may be isolated by a trench isolation instead of the oxide layer 9. The selected word line WL may be changed to the low (L) level by connecting it to ground or a source of a voltage somewhat higher than the ground potential.

Although this invention has been described in conjunction with specific embodiments thereof, it is evident that may alternatives, modifications and variations will be apparent to those skilled in the art. Accordingly, it is intended to embrace all alternatives, modifications and variations that fall within the scope of the appended claims.

What is claimed is:

1. A semiconductor memory device having a number of memory cells, each of which is written to and read from individually, each of said cells comprising:
    a diode having first and second electrodes, the first electrode beng connected to a bit line;
    a storage capacitor having first and second terminals, the first terminal being connected at a point to the second electrode of the diode, the second terminal being connected to a word line; and
    switch means for resetting said point to a predetermined potential, whereby said capacitor is positively reset in response to operation of said switch means.

2. The semiconductor memory device as claimed in claim 1, wherein the memory cells are divided into a plurality of memory-cell line segments each including a plurality of memory cells connected by a common word line, the memory cells being divided into a plurality of memory-cell row segments each including a plurality of memory cells connected by a common bit line.

3. The semiconductor memory device as claimed in claim 2, which includes isolation regions each isolating adjacent two memory-cell row segments from each other.

4. The semiconductor memory device as claimed in claim 2, wherein one memory-cell row segment is located between adjacent two word lines.

5. The semiconductor memory device as claimed in claim 2, wherein adjacent two memory-cell row segments are located between adjacent two word lines.

6. The semiconductor memory device as claimed in claim 2, wherein the resetting means includes switching circuits for the respective memory-cell line segments, each of the switching circuits being provided for simultaneously resetting all of the memory cells included in the corresponding one of the memory-cell line segments.

7. A semiconductor memory device having a number of memory cells, each comprising:
    a diode having first and second electrodes, the first electrode being connected to a bit line;
    a storage capacitor having first and second terminals, the first terminal being connected at a point to the second electrode of the diode, the second terminal being connected to a word line; and
    switch means for resetting said point to a predetermined potential;
    said memory cells being divided into a plurality of memory-cell line segments each including a plurality of memory cells connected by a common word line, the memory cells being divided into a plurality of memory cell row segments each including a plurality of memory cells, the memory cells alternatively arranged in one of the memory cell row segments being connected by a first common bit line, the other memory cells in the one memory cell row segment being connected by a second common bit line.

8. The smeiconductor memory device as claimed in claim 7, which includes isolation regions each isolating adjacent two memory-cell row segments from each other.

9. The semiconductor memory device as claimed in claim 7, wherein the resetting means includes switching circuits for the respective memory-cell line segments, each of the switching circuits being provided for resetting all of the memory cells included in the corresponding one of the memory-cell line segments.

* * * * *